Figure 1:
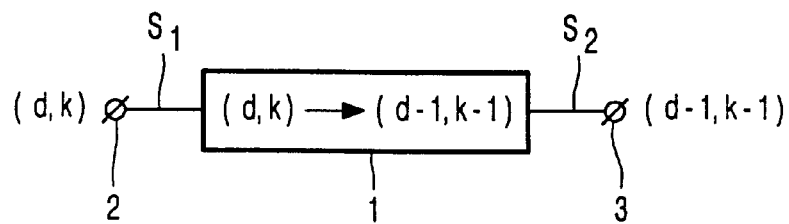
Figure 1:
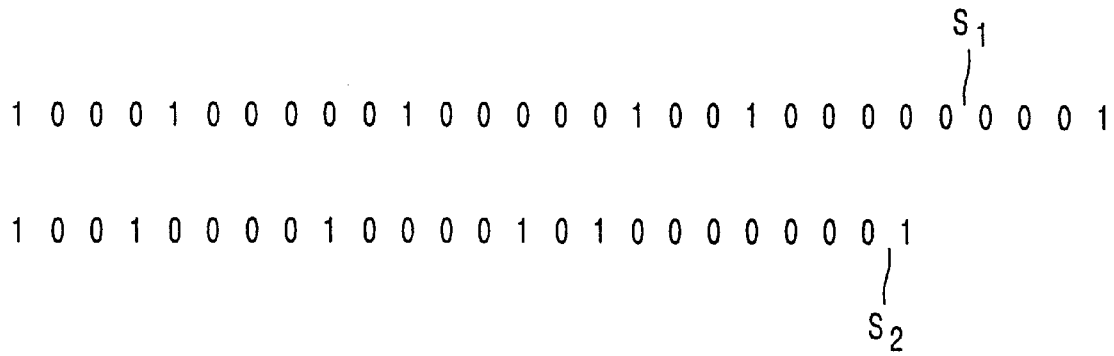

United States Patent
Kahlman et al.

[11] Patent Number: 6,157,325
[45] Date of Patent: Dec. 5, 2000

[54] ENCODING OF AN INPUT INFORMATION SIGNAL

[75] Inventors: Josephus A. H. M. Kahlman, Eindhoven; Kornelis A. Schouhamer Immink, Geldrop, both of Netherlands

[73] Assignee: U.S. Philips Corporation, New York, N.Y.

[21] Appl. No.: 09/307,978

[22] Filed: May 10, 1999

[30] Foreign Application Priority Data

May 13, 1998 [EP] European Pat. Off. .............. 98201515

[51] Int. Cl.$^7$ ...................................................... H03M 7/46
[52] U.S. Cl. ................................................................ 341/59
[58] Field of Search .................................. 341/56, 59, 57; 375/264; 371/43

[56] References Cited

U.S. PATENT DOCUMENTS

| | | | |
|---|---|---|---|
| 5,396,239 | 3/1995 | McMahon et al. | 341/58 |
| 5,477,222 | 12/1995 | Kahlman et al. | 341/95 |
| 5,696,505 | 12/1997 | Schouhamer Immink | 341/59 |
| 5,781,130 | 7/1998 | Mclaughlin et al. | 341/56 |

FOREIGN PATENT DOCUMENTS

0855680A1  7/1998  European Pat. Off. .......... G06T 9/00

OTHER PUBLICATIONS

"A Universal Algorithm for Generating Optimal and Nearly Optimal Runlentgh–limited, Charge Constrained Binary Sequences", by P.E. Bender et al, Proc. IEEE, Int. Symposium on Information Theory 1993, Santa Antonia, USA.

*Primary Examiner*—Brian Young
*Attorney, Agent, or Firm*—Michael E. Belk

[57] ABSTRACT

The invention proposes an apparatus for encoding an information signal. The information signal can be a $(d,k)$ sequence. The apparatus encodes the $(d,k)$ sequence into a $(d+n,k+n)$ sequence by changing the number of zeroes between each time two subsequent ones in the sequence by n. The information signal can also be a RLL sequence of the type $(d,k)$. The apparatus encodes the signal into a RLL sequence of the type $(d+n,k+n)$ by changing the runlengths by n bitcells each.

10 Claims, 2 Drawing Sheets ance is made in this respect to U.S. Pat. No. 5,477,222 (PHN
ENCODING OF AN INPUT INFORMATION SIGNAL The invention relates to an apparatus for encoding a runlength limited (RLL) information signal of the type (d,k) into an encoded information signal, the apparatus comprising:

input means for receiving an input signal, conversion means for converting the runlength limited t information signal into the encoded information signal, output means for supplying the encoded information signal.

The invention also relates to an apparatus for encoding a signal in the form of a (d,k) sequence into an encoded information signal, the apparatus comprising:

input means for receiving an input signal, conversion means for converting the runlength limited information signal into the encoded information signal, output means for supplying the encoded information signal.

The invention further relates to corresponding encoding methods for encoding the input information signal. An apparatus as defined above is well known in the art. Reference is made in this respect to U.S. Pat. No. 5,477,222 (PHN 14.448).

The apparatus described in the above identified publication is capable of generating a (d,k) sequence (which is also called an NRZI encoded signal), which upon precoding in a 1T precoder results in a runlength limited information signal of the type (d,k) (which is also called an NRZ encoded signal). The (d,k) sequence comprises at least d and at most k zeroes between subsequent ones that occur after each other in the (d,k) sequence. The runlength limited information signal obtained from the above (d,k) sequence comprises runlengths (either an array of consecutive zeroes or an array of consecutive ones) of d+1 at minimum and k+1 at maximum, between subsequent signal reversals in the information signal.

The invention aims at providing an improved encoding apparatus. In accordance with the invention, the apparatus for encoding apparatus for encoding a runlength limited information signal of the type (d,k) into an encoded information signal, the apparatus comprising:

input means for receiving an input signal, conversion means for converting the runlength limited t information signal into the encoded information signal, output means for supplying the encoded information signal, wherein the conversion means is adapted to convert the runlength limited information signal of the type (d,k) into a runlength limited information signal of the type (d+n,k+n) as the encoded information signal, by changing the runlengths in the runlength limited information signal by n bitcells of the runlength limited information signal, where n is a constant value.

Further, in accordance with the invention, the apparatus for encoding a signal in the form of a (d,k) sequence into an encoded information signal, comprises:

input means for receiving an input signal, conversion means for converting the runlength limited information signal into the encoded information signal, output means for supplying the encoded information signal, wherein the conversion means is adapted to convert the (d,k) sequence into a (d+n,k+n) sequence as the encoded information signal, by changing the number of zeroes between each time two subsequent ones in the (d,k) sequence by n, where n is a constant value.

The invention is based on the following recognition. Recently, a channel code called EFM+ was proposed for DVD optical disks. The EFM+ channel code is described in U.S. Pat. No. 5,696,505 (PHN 14746) and has a d constraint equal to 2. That means that the minimum runlength in the EFM+ modulated signal recorded on the disk equals 3. For recordable media, based on phase change, the edges of the pits on the record carrier are less well defined. When high bit densities are required on the disk, a channel code with a lower d constraint, such as d=1, is preferred. So, when going out from the same source material, different channel encoders would be required in order to obtain the channel encoded information signal needed for recording on the DVD disk and the recordable disk. The present invention overcomes this, by proposing a converter apparatus that converts the EFM+ encoded channel signal with a d constraint equal to 2, into another channel encoded signal that has a d constraint equal to 1. The conversion can be carried out in the NRZI domain or in the NRZ domain.

As a result, all runlengths will be shortened by one bitcell, resulting in a converted channel encoded signal which is also DC free, as was the original channel encoded signal.

Upon channel decoding, the runlengths can be enlarged by adding one bitcell, resulting in a replica of the original EFM+ modulated signal.

It should be noted in this respect that there is no need for n being an integer constant. Thus, runlengths could be changed by a length unequal to the length of an integer number of bitcells.

It should further be noted that the publication 'A universal algorithm for generating optimal and nearly optimal runlength-limited, charge constrained binary sequences' by P. E. Bender et al in Proc. IEEE, Int. Symposium on Information Theory 1993, Santa Antonia, USA, describes the stuffing of ones in a sequence in order to avoid a violation of the d or k constraints.

Figure 2:
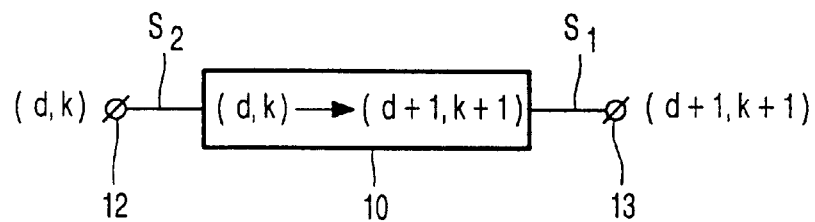
Figure 2:
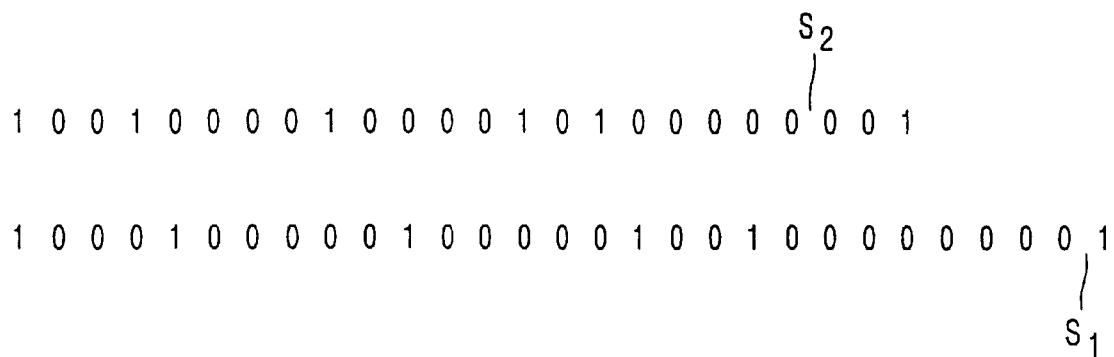
Figure 3:
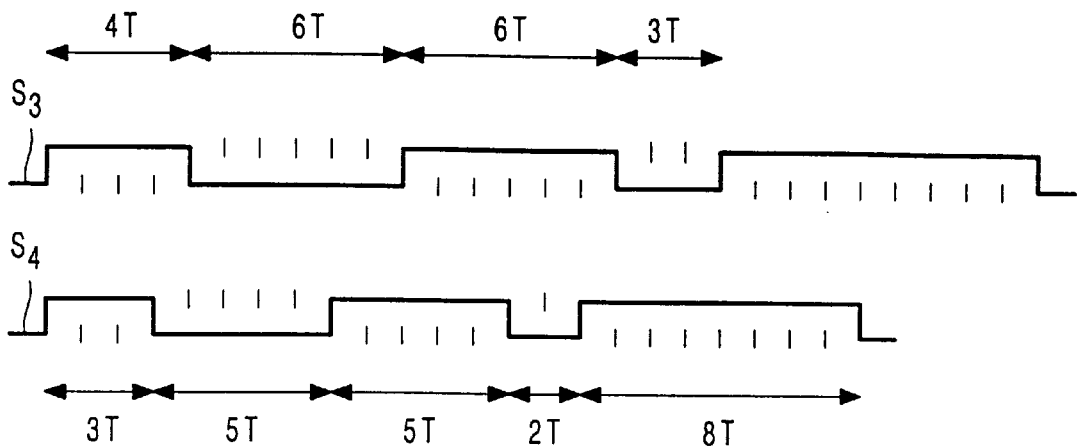
Figure 4:
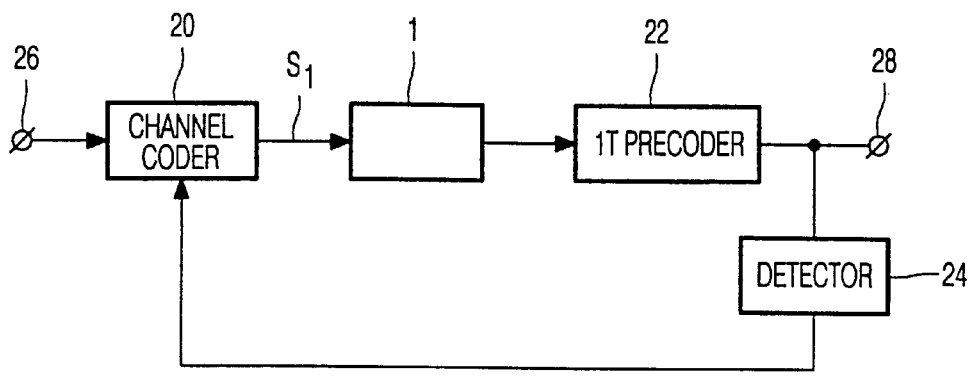
Figure 5:
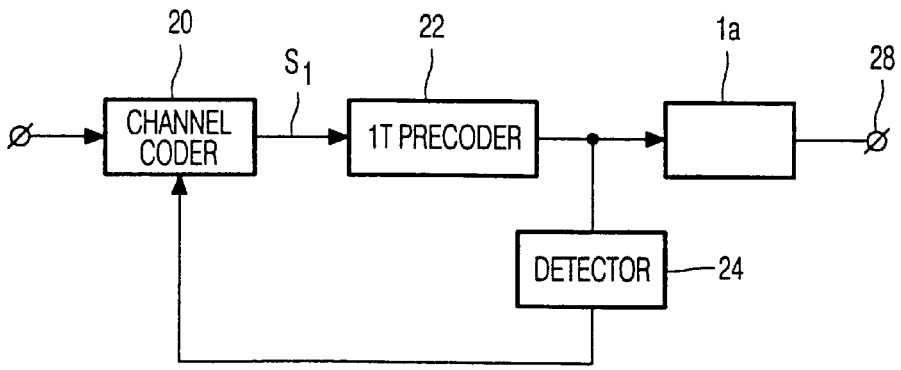

These and other aspects of the invention will be further described in the figure description, in which FIG. 1 shows an apparatus for converting a (d,k) sequence into a (d−1,k−1) sequence, FIG. 2 shows an apparatus for converting a (d,k) sequence into a (d+1,k+1) sequence, FIG. 3 shows the conversion of a RLL sequence of the type (d,k) into a RLL sequence of the type (d−1,k−1), FIG. 4 shows an embodiment of encoding apparatus further provided with a channel encoder for generating the (d,k) sequence, and FIG. 5 shows an embodiment of the encoding apparatus further provided with a channel encoder for generating a RLL sequence of the type (d,k).

FIG. 1 shows an apparatus 1 that converts a (d,k) sequence into a (d−1,k−1) sequence by deleting a zero from the array of zeroes that occur each time between two consecutive ones in the (d,k) sequence. A sequence $s_1$ is applied to the input 2 of the apparatus. FIG. 1 shows the signal $s_1$, which has a d constraint equal to 2, this for the reason that the number of zeroes between the fourth and the fifth one in the sequence is 2. Upon conversion, the sequence $s_2$ has been obtained. It follows from FIG. 1 that the number of zeroes between consecutive ones in the sequence $s_2$ each time has been decreased by one. As a result, the signal $s_2$ is a (d−1,k−1) constrained sequence. The signal $s_2$, obtained with the apparatus of FIG. 1 could, after having carried out a 1T precoding on the signal $s_2$, be recorded on a record carrier, such as an optical record carrier, eg. a DVD disk.

When viewed on a time scale, the two signals $s_1$ and $s_2$ will, of course, be substantially equally long. The difference lies in the fact that the bitrate for the signal $s_2$ is lower than for the signal $s_1$.

FIG. 2 shows an apparatus 10 that converts a (d,k) sequence into a (d+1,k+1) sequence by adding a zero to the array of zeroes that occur each time between two consecutive ones in the (d,k) sequence. A sequence $s_2$ is applied to the input 12 of the apparatus. FIG. 2 shows the signal $s_2$, which has a d constraint equal to 1, this for the reason that the number of zeroes between the fourth and the fifth one in the sequence is 1. Upon conversion, the sequence $s_1$ has been obtained. It follows from FIG. 2 that the number of zeroes between consecutive ones in the sequence $s_1$ each time has been increased by one. As a result, the signal $s_1$ is a (d+1,k+1) constrained sequence, which has the same bitrate as the signal $s_1$ in FIG. 1, assuming that the signal $s_2$ in FIG. 2 is the same signal as the signal $s_2$ in FIG. 1.

FIG. 3 shows a runlength limited signal $s_3$, with a minimum runlength of 3. An apparatus, alike the apparatus of FIG. 1, which is capable of changing the runlengths in the signal $s_3$ by subtracting one bitcell (or 1T) from each runlength occurring in the signal $s_3$, results in the signal $s_4$, also shown in FIG. 3. Conversely, an apparatus, alike the apparatus of FIG. 2, which is capable of changing the runlengths in the signal $s_4$, by adding one bitcell (or 1T) to each runlength occurring in the signal $s_4$, results in the signal $s_3$.

Here again, when viewed on a time scale, the two signals $s_3$ and $s_4$ will, of course, be substantially equally long. The difference lies in the fact that the bitrate for the signal $s_4$ is lower than for the signal $s_3$.

FIG. 4 shows an embodiment of the encoding apparatus, where the conversion unit 1 of FIG. 1 is used, together with a channel encoder 20, an aT precoder, more specifically a 1T precoder 22 and a detector 24. A source signal is supplied to the input 26, which is converted into the (d,k) sequence $s_1$. The channel encoder 20 can be any channel encoder, such as the EFM+ coder introduced earlier that channel encodes the input signal into the (d,k) sequence. After conversion in the converter unit 1, the converted signal is encoded in the 1T precoder, well known in the art, resulting in an output signal which is available at the output 28. The channel encoder encodes its input signal into the (d,k) sequence in response to a control signal supplied by the detector 24. The control signal may, as an example, lead to the output signal of the 1T precoder being DC free, or any other requirement to be imposed on the precoder output signal.

The channel coder 20 is preferably adapted to generate such a (d,k) sequence in response to the source signal, that the number of 'ones' per bit is substantially constant. In the earlier mentioned U.S. Pat. No. 5,477,222, single 2-bit source words were converted into single 3-bit converted words, or two subsequent 2-bit source words were converted into two subsequent 3-bit converted words, or three subsequent 2-bit source words were converted into three subsequent 3-bit converted words. One could imagine that the conversion of single 2-bit source words leads to converted words that include only one '1' bit, that the conversion of two subsequent 2-bit source words leads to two subsequent 3-bit converted words including two '1' bits and that the conversion of three subsequent 2-bit source words leads to three subsequent 3-bit converted words including three '1' bits. As a result, the output signal of the channel encoder 20 includes 1/3 '1' bits per bit.

A possible embodiment of a channel coder that is capable of realizing a constant number of 'ones' per bit, is as follows. Let us assume that the d constraint equals 1 and that a 7/12 conversion code is aimed at. 233 channel words of length 12 exist that satisfy the d=1 constraint and start with at least one 'zero', so that they can be concatenated freely. Of those 233 channel words, 11 channel words comprise only one 'one', 45 channel words comprise two 'ones', 84 channel words comprise three 'ones', 70 channel words comprise four 'ones', 21 channel words comprise five 'ones' and one channel word comprises six 'ones'.

The channel coder can now be realized by allocating the 84 channel words comprising three 'ones' each to a corresponding one of 84 7-bit source words. Further, choose 45 pairs of channel words comprising two or four 'ones'. Allocate each pair to one of 45 7-bit source words. As the sum of 45 and 84 equals 129, which is larger than 128, it is possible to realize the 7/12 channel code. Encoding is now realized as follows. Encoding of the 84 source words into the 84 channel words comprising three 'ones' is straightforward. As soon as a source word appears that corresponds to a pair of channel words, alternately the channel word comprising two 'ones' and the channel word comprising four 'ones' is chosen. As a consequence, a channel code conversion is carried out resulting in a channel signal comprising one 'one' per three bits.

FIG. 5 shows another embodiment of the encoding apparatus, in which the conversion as explained with reference to FIG. 3 is employed. Apart from the encoding unit 1a, which changes the runlengths in the way described above with reference to FIG. 3, the embodiment comprises, again, a channel encoder 20, an aT precoder, more specifically a 1T precoder 22 and a detector 24. The converter 1a is now located at another position, namely at the output of the 1T precoder, so that the converter 1a can convert the RLL sequence generated by the 1T precoder 22.

A source signal is supplied to the input 26, which is converted into the (d,k) sequence $s_1$. The channel encoder 20 can be any channel encoder, such as the EFM+ coder introduced earlier that channel encodes the input signal into the (d,k) sequence. The (d,k) sequence is encoded in the 1T precoder, well known in the art, resulting in the RLL sequence at its output. The converter 1a subsequently converts the RLL sequence, in the way described above, into the output signal, which is available at the output 28. The channel encoder encodes its input signal into the (d,k) sequence in response to a control signal supplied by the detector 24. The control signal may, as an example, lead to the output signal of the 1T precoder being DC free, or any other requirement to be imposed on the precoder output signal.

The channel coder 20 is preferably adapted to generate such a (d,k) sequence in response to the source signal, that the number of signal transitions per bit in the RLL sequence at the output of the precoder 22 is substantially constant. This could be realized by using a channel coder 20 as described above.

Whilst the invention has been described with reference to preferred embodiments therefor, it is to be understood that these are not limitative examples. Thus, various modification may become apparent to those skilled in the art, without departing from the scope of the invention, as defined by the claims.

It is expressly stated here that, although the word "encoding" is mostly used in transmitters/recording apparatuses, and the word "decoding" is mostly used in receivers/reproducing apparatuses to indicate that an encoding inverse to the encoding in the transmitter/recording apparatuses is carried out, there is no essential difference between those words. So, also receivers/reproducing apparatuses can be considered to be provided with enocoding apparatuses. Such encoding apparatuses encode the received/reproduced signal in a way inverse to the encoding during transmission/encoding.

An example: suppose that a transmitter/recording apparatus is provided with an encoding apparatus that changes the runlengths (number of zeroes) by +n bit cells (by +n), then the corresponding encoding apparatus in the receiver/reproducing apparatus changes the runlengths (number of zeroes) by −n bit cells (by −n).

Further, the invention lies in each and every novel feature or combination of features.

What is claimed is:

1. Encoding apparatus for encoding a runlength limited information signal of the type (d,k) into an encoded information signal, the apparatus comprising:

input means for receiving an input signal, conversion means for converting the runlength limited t information signal into the encoded information signal, output means for supplying the encoded information signal, wherein the conversion means is adapted to convert the runlength limited information signal of the type (d,k) into a runlength limited information signal of the type (d+n,k+n) as the encoded information signal, by changing the runlengths in the runlength limited information signal by n bitcells of the runlength limited information signal, where n is a constant value.

2. Encoding apparatus as claimed in claim 1, wherein the apparatus further comprises channel encoding means for channel encoding said input signal into said runlength limited information signal, the channel encoding means being adapted to generate said runlength limited information signal in response to said input signal, such that the number of transitions per bit in the runlength limited information signal is substantially constant.

3. Encoding apparatus as claimed in claim 1, wherein n is an integer constant, which preferably equals +1.

4. Encoding apparatus as claimed in claim 1, wherein n is an integer constant, which preferably equals −1.

5. Encoding method for encoding a runlength limited information signal of the type (d,k) into an encoded information signal, the method comprising the steps of:

receiving an input signal, converting the runlength limited t information signal into the encoded information signal, supplying the encoded information signal, wherein the conversion step is adapted to convert the runlength limited information signal of the type (d,k) into a runlength limited information signal of the type (d+n,k+n) as the encoded information signal, by changing the runlengths in the runlength limited information signal by n bitcells of the runlength limited information signal, where n is a constant value.

6. Encoding apparatus for encoding a signal in the form of a (d,k) sequence into an encoded information signal, the apparatus comprising:

input means for receiving an input signal, conversion means for converting the (d,k) sequence into the encoded information signal, output means for supplying the encoded information signal, wherein the conversion means is adapted to convert the (d,k) sequence into a (d+n,k+n) sequence as the encoded information signal, by changing the number of zeroes between each time two subsequent ones in the (d,k) sequence by n, where n is a constant value.

7. Encoding apparatus as claimed in claim 6 wherein the apparatus further comprises channel encoding means for channel encoding said input signal into said (d,k) sequence, the channel encoding means being adapted to generate said (d,k) sequence, such that the number of ones per bit in the (d,k) sequence is substantially constant.

8. Encoding apparatus as claimed in claim 6, wherein n is an integer constant, which preferably equals +1.

9. Encoding apparatus as claimed in claim 6, wherein n is an integer constant, which preferably equals −1.

10. Encoding method for encoding a signal in the form of a (d,k) sequence into an encoded information signal, the method comprising the steps of:

receiving an input signal, converting the (d,k) sequence into the encoded information signal, supplying the encoded information signal, wherein the conversion step is adapted to convert the (d,k) sequence into a (d+n,k+n) sequence as the encoded information signal, by changing the number of zeroes between each time two subsequent ones in the (d,k) sequence by n, where n is a constant value.

* * * * *